US008013284B2

(12) United States Patent
Caubet et al.

(10) Patent No.: US 8,013,284 B2
(45) Date of Patent: Sep. 6, 2011

(54) INTEGRATED ELECTROOPTIC SYSTEM

(75) Inventors: Pierre Caubet, Le Versoud (FR); Michael Gros-Jean, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/685,598

(22) Filed: Jan. 11, 2010

(65) Prior Publication Data

US 2010/0108867 A1    May 6, 2010

Related U.S. Application Data

(62) Division of application No. 11/655,773, filed on Jan. 19, 2007, now Pat. No. 7,667,173.

(30) Foreign Application Priority Data

Jan. 23, 2006    (FR) ...................................... 06 00561

(51) Int. Cl.
   *H01L 27/00*    (2006.01)
(52) U.S. Cl. .................. 250/208.1; 250/214.1; 250/226; 359/273; 359/275; 252/582
(58) Field of Classification Search ............... 250/208.1, 250/214.1, 226; 252/582, 583; 359/265, 359/269, 270, 273, 275
   See application file for complete search history.

(56) References Cited

U.S. PATENT DOCUMENTS

| 4,054,890 A | 10/1977 | Shimomura et al. |
| 4,256,372 A | 3/1981 | Yasukuni et al. |
| 4,354,754 A | 10/1982 | Takahashi et al. |
| 6,388,709 B1 | 5/2002 | Kobayashi et al. |
| 6,631,022 B1 * | 10/2003 | Kihira et al. .................. 359/265 |
| 6,861,014 B2 | 3/2005 | Fitzmaurice et al. |
| 6,867,894 B2 | 3/2005 | Asano et al. |
| 6,870,657 B1 | 3/2005 | Fitzmaurice et al. |
| 2003/0103151 A1 * | 6/2003 | Luo .............................. 348/273 |
| 2005/0046920 A1 | 3/2005 | Freeman et al. |

FOREIGN PATENT DOCUMENTS

| EP | 1 394 598 | 3/2004 |
| FR | 2 291 520 | 6/1976 |
| FR | 2 746 934 | 10/1997 |

OTHER PUBLICATIONS

Preliminary French Search Report, FR 06 00561, dated Aug. 23, 2006, 2 pages.

Jiming, et al., "Study on Electrochemical Porosity of Titanium Based IrO2-Ta2O5 Anodes", Chinese Journal of Rare Metals, vol. 24, No. 5, pp. 345-348, Sep. 2000.

* cited by examiner

*Primary Examiner* — Kevin Pyo
(74) *Attorney, Agent, or Firm* — Gardere Wynne Sewell LLP

(57) ABSTRACT

An integrated circuit includes at least one photosensitive element capable of delivering an electrical signal when light of at least one wavelength of the visible spectrum reaches it, and an electrooptic system functioning as an electrochemical shutter. The electrooptic system is located in the path of at least one light ray capable of reaching the photosensitive element and possesses at least one optical property, dependent on electrochemical reaction, that can be modified by an electrical control signal. The optical property is preferably transmission.

16 Claims, 3 Drawing Sheets

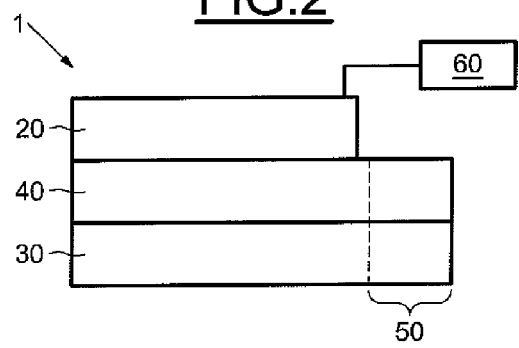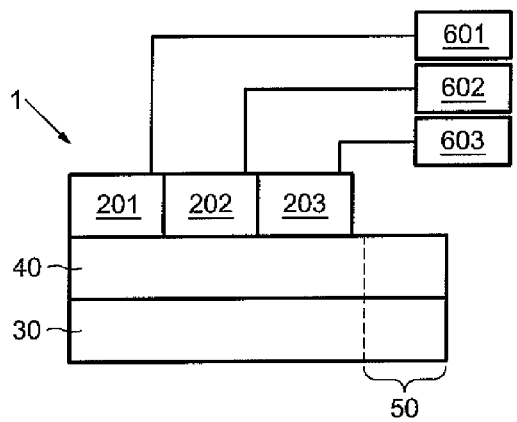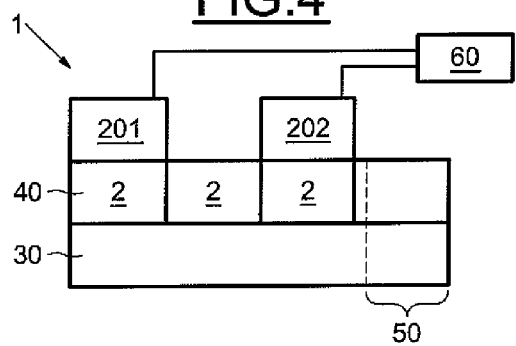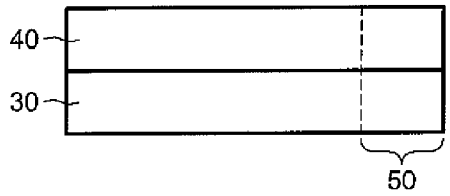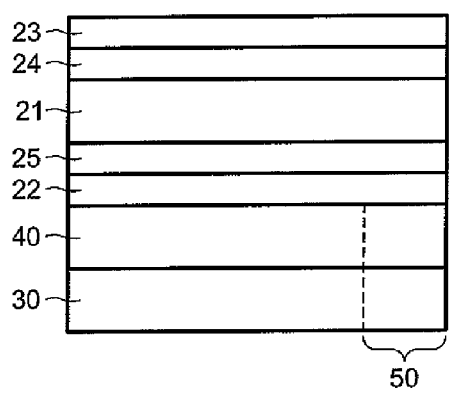

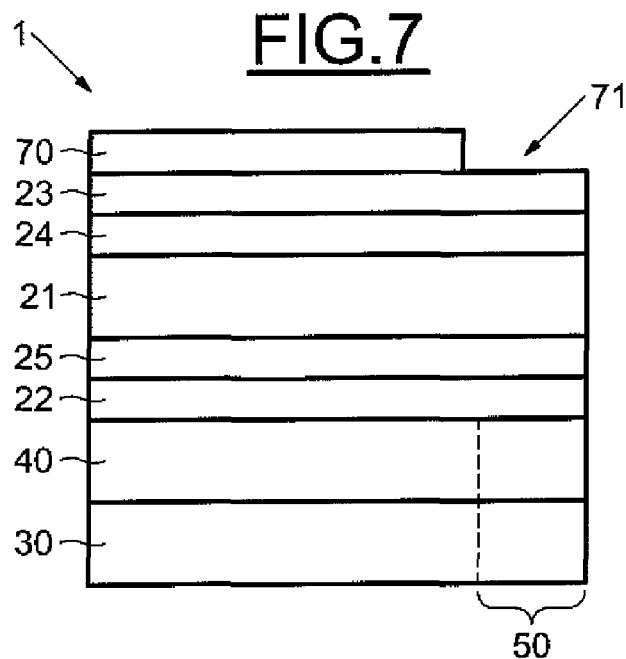
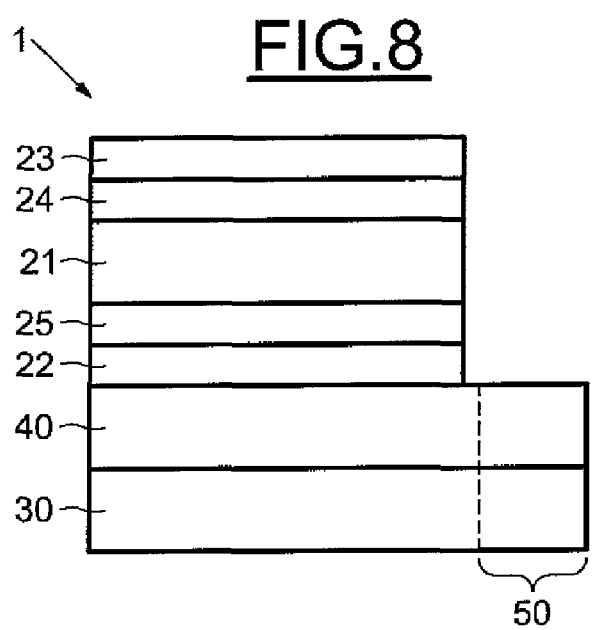

INTEGRATED ELECTROOPTIC SYSTEM

PRIORITY CLAIM

The present application is a divisional application from U.S. patent application Ser. No. 11/655,773 filed Jan. 19, 2007 which claims priority from French Application for Patent No. 06 00561 filed Jan. 23, 2006, the disclosures of which are hereby incorporated by reference.

BACKGROUND

1. Technical Field

The present invention relates to integrated circuits and more particularly to integrated circuits comprising photosensitive elements temporarily exposed to visible radiation.

2. Description of Related Art

Integrated photosensitive elements are widely used at the present time in photographic equipment—such as, digital cameras or detectors. In theory, and contrary to silver films, the integrated photosensitive elements may detect, almost continuously, visible radiation without being irreversibly modified by said radiation. It is therefore possible to expose integrated photosensitive elements during set-up phases or during any other period when the detected image is not being recorded. During these periods, the detected image can be displayed, for example using a screen, and the recording takes place at the moment desired by the user, when the detected image corresponds to that desired. One of the consequences of the operation of these photosensitive elements is the absence of a shutter—the image is recorded electronically and no longer mechanically. The integrated photosensitive elements are therefore continuously exposed and must remain operational throughout the lifetime of the equipment.

Now, it is apparent that the integrated photosensitive elements such as photodiodes may become degraded due to the effect of the light. This is because photons reaching a photodiode normally create electron-hole pairs generating an electrical current proportional to the number of photons received by the photodiode. Now, it turns out that an electron-hole pair recombines within the photodiode, releasing energy liable to damage the molecular bonds of the material forming the photodiode. As a result, the photosensitive element may lose its sensitivity or its effectiveness because of prolonged exposure to the radiation. It is therefore necessary to reduce the exposure of these elements.

Hitherto, systems used for controlling the opening and closing of photographic equipment act as shutters, which open temporarily or close. Such systems cannot be envisaged for equipment fitted with photodiodes, as they would prevent the image from being detected outside the recording periods. It would therefore no longer be possible to make adjustments while displaying the detected image on a screen. It is consequently necessary to provide equipment that takes advantage of photodiodes while limiting the ageing due to prolonged exposure of said photodiodes to light.

There is a need to remedy the abovementioned drawbacks. The present invention proposes an integrated circuit capable of continuously detecting an image while limiting the deterioration of the integrated circuit.

SUMMARY

An embodiment proposes an integrated circuit comprising at least one photosensitive element capable of delivering an electrical signal when light of at least one wavelength of the visible spectrum reaches it, and an electrooptic system. The electrooptic system is located in the path of at least one light ray capable of reaching the photosensitive element and possesses at least one optical property that may be modified by an electrical control signal. The electrooptic system is capable of limiting the degradation of the photosensitive element during a so-called set-up period. In addition, the modified optical property of the electrooptic system is advantageously the transmission coefficient.

Thus, it is possible to transmit or cut off, electrically, a range of wavelengths of light capable of reaching the photosensitive element and capable of degrading it. The transmission coefficient of the electrooptic system varies reversibly between two states depending on the electrical control signal. In one of the states, the electrooptic system is almost transparent for the wavelength range in question and allows the photosensitive element to detect light little altered or unaltered by the electrooptic system. In the other state, the electrooptic system absorbs or reflects all or part of the wavelength range in question so as to limit the degradation of the photosensitive element.

According to one aspect, the photosensitive element comprises a photodiode. In addition, the photodiode comprises amorphous or polymorphic hydrated silicon. This is a photosensitive element whose degradation in light is due to the recombination of electron-hole pairs. The recombination of electron-hole pairs within amorphous or polymorphic hydrated silicon is capable of breaking the weak bonds between silicon atoms and therefore of creating pendent bonds. These pendent bonds reduce the sensitivity of the material, and therefore its lifetime.

According to one embodiment, the electrooptic system is capable of filtering out more than 80% in energy of all of the wavelengths of the visible spectrum.

This embodiment makes it possible to filter out almost the entire visible spectrum. What is therefore obtained is an optical system having two states, namely an open state and a closed state, which is electrically controlled. The electrooptic system therefore acts in the same way as a mechanical shutter by controlling the exposure of a photosensitive element.

According to a preferred embodiment, the electrooptic system is capable of filtering out more than 80% in energy of the long wavelengths of the visible spectrum. The electrooptic system is capable of limiting the degradation of the photosensitive element by filtering out more than 80% in energy of the red-orange wavelengths, in particular of the wavelengths comprised between 600 nm and 800 nm.

What are filtered out are the wavelengths close to 600-800 nm, which correspond to the red-orange colors of the visible spectrum. According to this embodiment, the electrooptic system makes it possible, in one state, to let light through that is little altered or unaltered and, in the other state, to filter out the wavelengths close to red. In the latter case, the system is in particular transparent to the shorter wavelengths close to blue, that is to say it has a blue color in transmission. This is because the wavelengths close to red produce a larger reduction in the electric field within the photodiode than the other wavelengths. Now, it is this electric field that makes it possible to separate the electron and the hole that form when a photon is absorbed. If the electron and the hole are not separated sufficiently rapidly, there is a risk of them recombining and of degrading the photodiode. In other words, the long wavelengths of the visible spectrum cause more rapid degradation of the photodiode than the shorter wavelengths. The electrooptic system as proposed according to one aspect of the invention makes it possible to filter out the wavelengths that cause the most rapid degradation of the photosensitive element.

According to a preferred embodiment, the electrooptic system comprises an electrooptic material comprising tungsten oxide ($WO_3$). Tungsten oxide is chosen because, in its reduced state ($HWO_3$), it has a blue color in transmission and therefore makes it possible to filter out the long wavelengths of the visible spectrum. However, in its oxidized state, tungsten oxide $WO_3$ is almost colorless in transmission, and therefore results in little or no disturbance of the transmitted light.

It is also advantageous in this same embodiment to use an electrolyte comprising a layer of hydrated tantalum oxide ($Ta_2O_5$). Hydration of the electrolyte allows more rapid conduction of the $H^+$ ions. It therefore allows the oxidation or reduction rate of tungsten oxide to be increased and consequently the rate of response of the system to be increased.

According to another embodiment, the electrooptic system is capable, depending on the electrical control signal, of filtering out more than 80% in energy of the red-orange wavelengths of the visible spectrum or the wavelengths of another range of the visible spectrum.

Thus, during the set-up period, the electrooptic system is blue in transmission for almost all the photodiodes and during the period of recording the image, the electrooptic systems each filter out a range of wavelengths so as to replace the matrix of color filters that allows the color to be detected.

Another aspect proposes a process for fabricating an integrated circuit comprising a photosensitive element delivering an electrical signal when light of at least one wavelength of the visible spectrum reaches it, and an electrooptic system capable of limiting the degradation of the photosensitive element. The electrooptic system is produced by depositing at least one material, at least one optical property of which varies during an electrochemical reaction, the integrated circuit having a high transmission between said electrooptic system and said photosensitive element.

According to a preferred method of implementing the process, an electrolyte comprising hydrated tantalum oxide is also deposited, in order to produce the electrooptic system.

According to a preferred method of implementation, the electrolyte comprising tantalum oxide is produced by deposition at a temperature between 100° C. and 400° C. and with a precursor partial pressure of between 1 mPa and 130 Pa, or even 200 Pa. In addition, the tantalum oxide after it has been deposited is immersed in an aqueous solution for a time of between 1 second and 10 hours.

The conditions for depositing the tantalum oxide layer make it possible to obtain a layer with a high porosity. This porosity will make it possible, secondly, during its immersion in an aqueous solution, for the tantalum oxide to also be substantially hydrated. Thus, the tantalum oxide layer that forms the electrolyte in the electrooptic system will allow the $H^+$ ions to be conducted more easily and more rapidly, these ions being the basis of the electrochemical reaction that causes the change in optical transmission coefficient of the tungsten oxide. It will thus be possible to change the transmission coefficient of the electrooptic system more rapidly.

The invention also relates to the use of an integrated circuit comprising a photosensitive element and an electrooptic system which is located in the path of at least one light ray reaching said photosensitive element. The electrooptic system possesses at least one optical property that may take two different values depending on an electrical control signal so as to filter out, a different range of the visible spectrum, and the optical property of the electrooptic system is made to pass from one value to another depending on whether or not it is desired to attenuate one part of said range of the visible spectrum.

The use of an electrooptic system within an integrated circuit able to detect light radiation allows the ageing of the photosensitive element to be limited. This is because, during the set-up or standby phase of taking a photograph, the electrooptic system may be placed in a state in which it filters out a range of the visible spectrum to more than 80% so as to let through only the wavelengths that are the least dangerous to the photosensitive element. However, when the image has to be recorded, the electrooptic system switches to another state in which it transmits more than 80% of the same range of the visible spectrum so as to little impair the recording by the photosensitive element. Once the recording has been made, the electrooptic system can again be switched to the first state. Thus, the photosensitive element is exposed to the range of dangerous wavelengths only at discrete times, thereby preserving its lifetime. However, it remains exposed to part of the visible spectrum during the set-up period, thereby making it possible to display or adjust the equipment before recording the image, while limiting deterioration of the photosensitive elements.

In an embodiment, an integrated circuit comprises: a plurality of first layers forming a photosensitive element; and a plurality of second layers forming an electrochemical shutter, the plurality of second layers overlying the plurality of first layers; wherein the electrochemical shutter has a first transmission mode that is substantially transparent and a second transmission mode which blocks certain wavelengths of light from reaching the photosensitive element.

In another embodiment, an optical imaging system comprises: an imaging array of photosensitive elements suitable for producing an optical image; and an electrooptic system which covers the imaging array, the electrooptic system having a blocking transmission mode which allows a reduced amount of visible light to impinge upon the imaging array so that the produced optical image is a reduced wavelength image used during image set-up, and further having a transparent transmission mode which allows substantially all visible light to impinge upon the imaging array so that the produced optical image is a full wavelength image used during image acquisition.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 1 to 8 illustrate schematically various embodiments and the steps of one method of implementing the process according to the invention, wherein:

FIG. 1 is a sectional view of part of an integrated circuit comprising a photosensitive element comprising an electrooptic system;

FIGS. 2 to 4 are variants of FIG. 1; and

FIGS. 5 to 8 represent the various steps of carrying out one method of implementing the process.

DETAILED DESCRIPTION OF THE DRAWINGS

Figure 1:
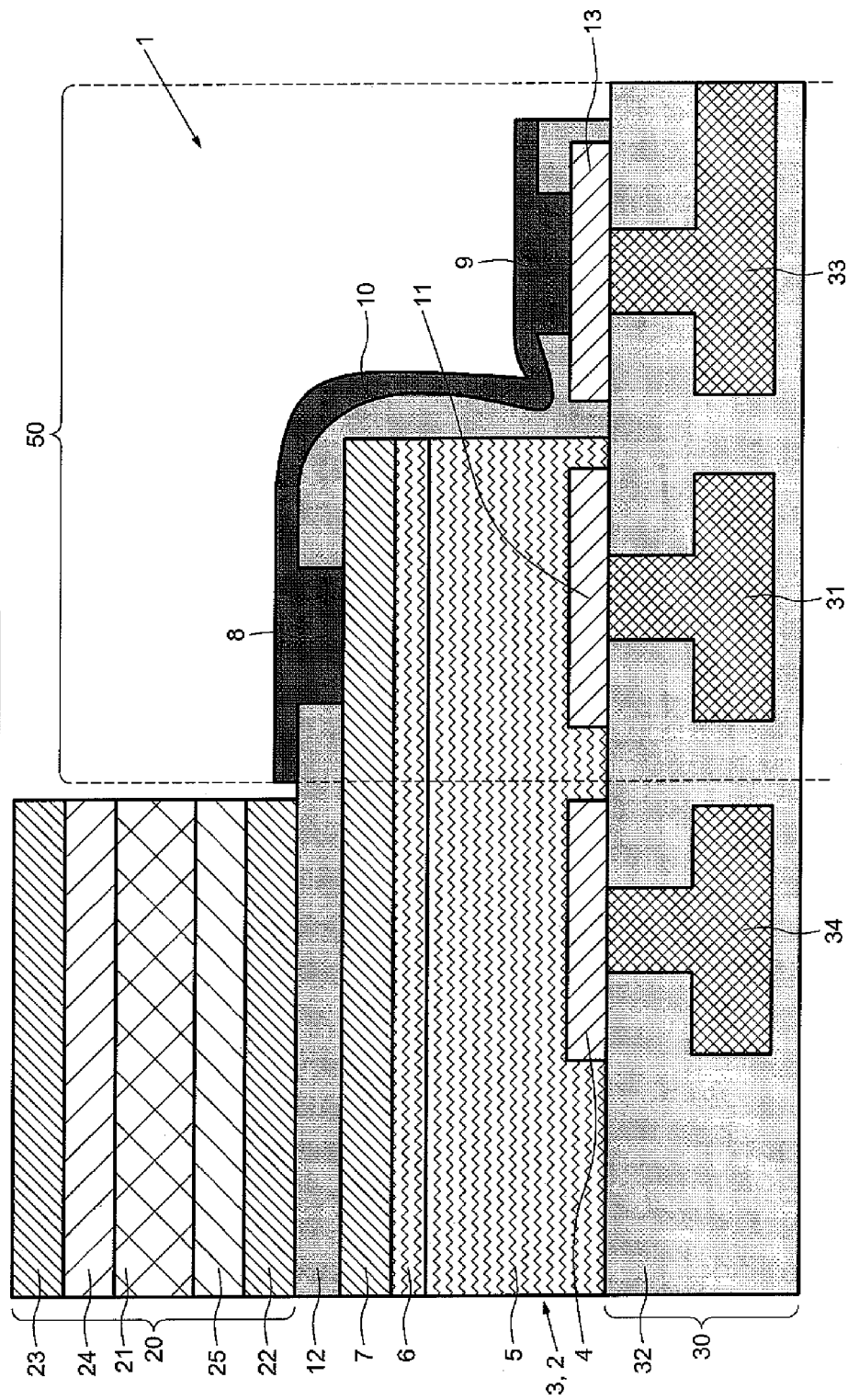

The integrated circuit 1 in FIG. 1 comprises a photosensitive element 2 which is for example a photodiode, a reference photodiode 3, an interconnection region 30 and an electrooptic system 20. The photodiodes 2 and 3 at least partly cover the interconnection region 30, while the photodiode 2 is at least partly covered by the electrooptic system 20.

Each photodiode 2 comprises a conducting first layer 4 advantageously comprising chromium and constituting a first electrode. The layer 4 is placed on part of the interconnection region 30 and is largely covered by a second layer 5, which comprises for example undoped, amorphous or polymorphic, hydrated silicon. A third layer 6 comprising p-doped, amorphous or polymorphic, hydrated silicon is placed on the second layer 5, and a conducting fourth layer 7 is placed on the layer 6. Advantageously, the layer 7 comprises indium tin oxide (ITO), which is almost transparent and constitutes the second electrode of the photodiode. A layer 12 at least partly covers the conducting layer 7 and advantageously comprises tetraethyl orthosilicate (TEOS), which is an almost transparent dielectric.

The reference photodiode 3 also comprises a conducting first layer 11 placed on part of the interconnection region 30 and advantageously comprising chromium. The layer 11, which constitutes the first electrode, is also covered by the layers 5, 6, 7 and 12 described above, which are common to the two photodiodes 2 and 3. The reference photodiode 3 is also covered laterally by the dielectric layer 12, which is deposited on at least one end of the layers 5, 6 and 7 and on part of the interconnection region 30.

A third layer 13, advantageously comprising chromium and partly covering the interconnection region 30, is located to the side of the photodiodes 2 and 3 and is also at least partly covered by the dielectric layer 12. The dielectric layer 12 is covered, at the photodiode 3, the layer 13 and the sidewall of the photodiode 3, with an opaque conducting layer 10. The layer 10 is connected to the second electrode 7 common to the two photodiodes, by means of a via 8 that passes through the layer 12, and to the layer 13 by means of a via 9, which also passes through the dielectric layer 12.

The reference photodiode 3 has the same structure as the photodiodes 2 apart from the fact that it is covered by the opaque layer 10. The photodiode 3 therefore makes it possible to determine the current delivered by a photodiode when there are no photons and therefore serves as reference for the current delivered by the photodiode 2.

The interconnection region 30 comprises a dielectric region 32 containing TEOS and at least three conducting tracks 31, 33 and 34, each advantageously comprising aluminum or copper. The conducting track 34 is connected to the first electrode 4 of the photodiode 2. The conducting track 31 is connected to the first electrode 11 of the reference photodiode 3. Finally, the conducting track 33 is connected to the layer 13, and consequently to the second electrode 12 of the photodiodes 2 and 3, by means of the vias 8 and 9 and the conducting layer 10. Thus, the current produced by the photodiode 2 is conducted by the tracks 34 and 33 to the signal processing system, whereas the current of the photodiode 3 is conducted by the tracks 31 and 33 to the signal processing system that will use it as optical reference in order to process the current of the photodiode 2. The reference 50 denotes that part of the integrated circuit which comprises the reference photodiode 3, the layer 13 and the tracks 31 and 33.

The opaque conducting layer 10 is bounded, at one of its ends, by the boundary between the photodiode 2 and the photodiode 3. The opaque layer 10 covers the photodiode 3 so that practically no photons can reach the reference photodiode 3, while still avoiding covering the photodiode 2 which is used to detect the incident photons. The dielectric layer 12 is therefore not covered by the opaque layer 10 on that part located at the photodiode 2. Thus, the electrooptic system 20 is placed, on top of the layer 12, in line with the photodiode 2.

The system 20 comprises an electrolyte 21 placed between two electrodes 22, 23, which advantageously comprise ITO. The electrode 22 at least partly covers that part of the layer 12 located in line with the photodiode 2. Placed between the electrode 23 and the electrolyte 21 is a first electrochemical material 24 advantageously comprising tungsten oxide. The material 24 filters out the wavelengths close to red in its reduced state and is almost transparent in its oxidized state. Optionally, a second electrochemical material 25 may be placed between the electrolyte 21 and the electrode 22. The material 25 may for example comprise iridium oxide $IrO_2$, which is transparent, as thin film, in its reduced state and in its oxidized state.

Thus, for example, the layer 24 may comprise oxidized tungsten oxide ($WO_3$) and the layer 25 reduced iridium oxide ($HIrO_2$). In this way, when the system 20 is used for the first time, the voltage applied between the electrodes causes the $H^+$ ions to migrate from the layer 25 towards the layer 24 via the layer 21, which is a conductor of $H^+$ ions. There is then an oxidation reaction in the layer 25, in which $HIrO_2$ forms the iridium oxide $IrO_2$, whereas in the layer 23 a reduction reaction takes place in which the tungsten oxide $WO_3$ is reduced to $HWO_3$, which is blue in transmission. The system is therefore stable and allows the long wavelengths to be filtered out. The applied voltage can then be removed.

To return to the initial state, it is sufficient to apply a reverse voltage to the system. The $H^+$ ions then migrate from the layer 23, where the $HWO_3$ reduction takes place, towards the layer 22 where the oxidation of $IrO_2$ takes place. When these two reactions are complete, the system is again stable and almost transparent. It is then possible to stop applying a voltage.

It is also possible to form the system 20 with a layer 24 that comprises reduced tungsten oxide ($HWO_3$) and with a layer 25 that comprises oxidized iridium oxide ($IrO_2$). In this case, when the system 20 is used for the first time, the voltage applied between the electrodes makes the $H^+$ ions migrate from the layer 24 towards the layer 25 via the layer 21.

In FIG. 2, the integrated circuit 1 comprises a matrix 40 of photodiodes 2, which are produced on an interconnection region 30, and the part 50 corresponding to the reference photodiode 3. The photodiodes 2 and 3 may be similar to those illustrated in FIG. 1. The integrated circuit 1 comprises a control system 60 and an electrooptic system 20 located on top of the photodiodes 2. The system 60 is connected to the electrodes of the electrooptic system 20 and applies or does not apply, depending on the case, a positive or negative voltage. The system 60 controls the entire electrooptic system 20.

Thus, when the photodiodes 2 are used during a set-up period, the system 60 temporarily imposes a voltage, for example a positive voltage, on the electrooptic system 20 so that it is blue in transmission. The exposed photodiodes 2 are therefore less impaired by the detected light and the user can display (possibly in shades of grey) the image detected by the photodiodes. When the user decides to record the image, the control system temporarily imposes a negative first voltage so as to make the electrooptic system 20 transparent while recording the image, and then temporarily imposes a positive second voltage so that the electrooptic system 20 becomes blue again in transmission. In this way, it is possible to benefit from the advantages of integrated photosensitive elements while limiting their deterioration by the light. It may be noted that the electrooptic system 20 may be superimposed on a matrix of three color filters, such as red, green and blue filters, in order to allow colors to be detected. In this case, the photodiodes 2 associated with the red and green filters will detect nothing during the set-up period.

In FIG. 3, an integrated circuit 1 comprises a matrix 40 of photodiodes 2, which are produced on an interconnection region 30, and the part 50 corresponding to the reference photodiode 3. The integrated circuit 1 comprises three control systems 601, 602, 603 and three electrooptic systems 201, 202, 203 located on top of the photodiodes 2. The systems 601, 602, 603 are connected to the electrodes of the electrooptic systems 201, 202, 203 respectively. The electrooptic systems 201, 202, 203 may thus be associated with three categories of photodiodes.

It is then possible to associate the systems 201, 202, 203 with three successive regions of the matrix 40, each comprising several photodiodes 2. During the set-up period that precedes the recording of an image, the control systems 601, 602, 603 are parameterized so that the three electrooptic systems 201, 202 and 203 are not all blue in transmission at the same time. In this way, it is possible to use the signals from the temporarily unprotected photodiodes 2 to display the detected image on a screen. The user can thus carry out his adjustments. Throughout the set-up period, the systems 601, 602, 603 may be parameterized so that the electrooptic system that is transparent, for example the system 201, is not always the same and switches with the other two systems 202, 203. The image thus detected has a lower resolution only during the set-up period. When the image is being recorded, the three electrooptic systems 201, 202, 203 are switched so as all three to be transparent.

It is also possible to associate the three electrooptic systems 201, 202, 203 with the three colors detected, namely red, green and blue. In this case, the second electrochemical material within the electrooptic system (and corresponding to layer 25 in FIG. 1) may be chosen so as to be red or green when the system is in record mode. Thus, it is no longer necessary to have a matrix of color filters on the photodiodes. It is sufficient, in one state, for all the electrooptic systems to be blue in transmission (set-up period) and, in the other state, for the electrooptic systems to be colored so as to recreate the matrix of filters that allows colors to be detected. It is therefore no longer necessary to have an additional matrix of color filters and, in addition, the photodiodes associated with the red filters or with the green filters remain operational during the set-up phase. The image detected during the set-up phase is in shades of grey and has a better resolution since practically all the photodiodes can be used. It may also be noted that this embodiment may also be produced using electrochemical materials that are blue in transmission in one state (for the set-up period) and are red or green in transmission in the other state (for the record period).

In FIG. 4, an integrated circuit 1 comprises a matrix 40 of photodiodes 2, produced on an interconnection region 30, and the part 50 corresponding to the reference photodiode 3. The integrated circuit 1 comprises a control system 60 and two electrooptic systems 201, 202 located on top of certain photodiodes 2. The system 60 is connected to the electrodes of the electrooptic systems 201 and 202. The electrooptic systems 201, 202 are located on top of the photodiodes 2 used to detect red and green. This is because when one of the filters used to detect colors is the blue filter, it is unnecessary to have, on top of the associated photodiodes 2, an electrooptic system since the photodiodes already detect that of the light filtered in the long wavelengths. In addition, in this embodiment, it is also possible to use electrooptic systems that are blue in transmission in one state, and red or green in transmission in the other. Thus, the matrix of color filters used to detect color may be replaced. The color in transmission of the electrooptic system depends on the nature of the materials chosen for the electrochromic layers (which correspond to layers 24 and 25 in FIG. 1) and also on the degree of oxidation or reduction used.

FIGS. 5 to 8 show the various steps in the production of an electrooptic system according to one aspect of the invention.

In FIG. 5, the integrated circuit 1 comprises a matrix 40 of photodiodes 2 that are produced on the surface of an interconnection region 30.

The various layers 22, 25, 21, 24, 23 constituting the electrooptic system are produced in succession on the matrix 40. The first layer 22 is the conducting electrode comprising indium tin oxide (ITO). The layer 22 is produced for example by physical vapor deposition (PVD) using a target comprising indium tin oxide or else using a target comprising indium and tin, with a plasma comprising argon and oxygen. The layer is deposited with a thickness of between 0.1 and 100 nm, and preferably 50 nm. Once the layer comprising ITO has been produced on the surface of the photodiodes 2, an electrochemical layer 25, comprising transparent iridium oxide ($IrO_2$) or else another material that may be red or green in transmission in the reduced state, depending on the embodiment that it is desired to produce, may optionally be deposited. The iridium may be deposited by PVD using an iridium or iridium oxide target, with an argon/oxygen plasma. The layer is deposited with a thickness of between 0.1 and 500 nm. The electrolyte 21 is then produced. The electrolyte comprises porous tantalum oxide ($Ta_2O_5$). The tantalum oxide is deposited by chemical vapor deposition (CVD), by atomic layer deposition (ALD) or by plasma-enhanced atomic layer deposition (PEALD). The layer is deposited with a thickness of between 0.1 and 200 nm, and preferably about 30 nm. The deposition temperature is advantageously chosen to be between 100° C. and 400° C. and the precursor partial pressure is also chosen to be between 1 mPa and 130 Pa, or even 200 Pa. In this way, it is possible to obtain a tantalum oxide layer with a high porosity. The porous layer is then immersed in an aqueous solution for a time of between 1 second and 10 hours in order to obtain a high conductivity for $H^+$ ions.

This method of deposition makes it possible to deposit a single monolayer of tantalum oxide to form the electrolyte 21. In addition, the electrolyte 21 thus formed has high conductivity for $H^+$ ions, thereby reducing the response time of the system. A second layer 24 of an electrochemical material is then deposited. This is hydrated tungsten oxide $HWO_3$, deposited by PVD using a tungsten or tungsten oxide target, with an argon/water plasma or with an argon/hydrogen/oxygen plasma. The layer may also be deposited by CVD using a tungsten source, such as tungsten hexafluoride ($WF_6$) with a water or hydrogen/oxygen plasma. The layer may also be obtained by depositing a tungsten layer, treated in a second step by a plasma comprising water or hydrogen or oxygen or dinitrogen monoxide. The layer is deposited with a thickness of 0.1 to 500 nm. Finally, an ITO layer is deposited as previously, in order to form the transparent conducting second electrode 23 (cf. FIG. 6).

Once the layers 22, 25, 21, 24, 23 have been deposited, a resist 70 is deposited which is irradiated in order to form an aperture 71 on top of the reference photodiode 3 (cf. FIG. 7).

The layers constituting the electrooptic system 20 are etched at the aperture 71 in order to obtain the integrated circuit as shown in FIG. 8. In particular, the electrode 22 is etched so as to no longer be in contact with the opaque conducting layer 10 located in line with the reference photodiode 3.

The circuit thus obtained has many advantages. It is also apparent, in view of the production process, that it is unnecessary to have glass substrates on each side of the electrooptic system to ensure that it is rigid. This reduces the weight and the size of the electrooptic system.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for fabricating an integrated circuit comprising:
   forming a photosensitive element delivering an electrical signal when light of at least one wavelength of the visible spectrum reaches the photosensitive element, wherein the photosensitive element comprises a photodiode comprising amorphous or polymorphic hydrated silicon; and
   forming an electrooptic system over the photosensitive element by depositing at least one material, wherein the material has at least one optical property of which varies during an electrochemical reaction, the electrooptic system having a first mode of operation allowing a high transmission between said electrooptic system and said photosensitive element.

2. The process according to claim 1, wherein the varying optical property of the electrooptic system is a transmission coefficient, the electrooptic system having a second mode of operation which filters out more than 80% of energy of the red-orange wavelengths of the visible spectrum from reaching the photosensitive element.

3. The process according to claim 1, wherein the varying optical property of the electrooptic system is a transmission coefficient, the electrooptic system having a second mode of operation which filters out more than 80% of energy in all wavelengths of the visible spectrum from reaching the photosensitive element.

4. The process according to claim 1, wherein the varying optical property of the electrooptic system is a transmission coefficient, the electrooptic system having a second mode of operation which filters out more than 80% energy of relatively long wavelengths of the visible spectrum from reaching the photosensitive element.

5. The process according to claim 1, wherein forming the electrooptic system comprises depositing an electrolyte layer, and wherein depositing the electrolyte layer comprises depositing a layer of porous tantalum oxide and hydrating the deposited layer of porous tantalum oxide.

6. The process according to claim 5, wherein depositing the layer of porous tantalum oxide comprises depositing tantalum oxide at a temperature between 100° C. and 400° C. and with a precursor partial pressure of between 1 mPa and 200 Pa.

7. The process according to claim 5, wherein hydrating comprises immersing the layer of porous tantalum oxide in an aqueous solution.

8. A process for fabricating an integrated circuit comprising:
   forming a plurality of first layers which comprise a photosensitive element, wherein one of first layers of the photosensitive element that is formed comprises a layer of amorphous or polymorphic hydrated silicon; and
   forming a plurality of second layers which comprise an electrochemical shutter, the plurality of second layers overlying the plurality of first layers, wherein one of the second layers of the electrochemical shutter that is formed comprises a deposited layer of porous tantalum oxide hydrated by immersion in aqueous solution so as to form an electrolyte layer;
   wherein the electrochemical shutter possesses a first transmission mode that is substantially transparent and further possesses a second transmission mode which blocks certain wavelengths of light from reaching the photosensitive element.

9. The process of claim 8 wherein forming the second plurality of layers comprises:
   providing a first electrode layer;
   providing a second electrode layer; and
   providing a first electrochemical material layer placed between the first and second electrode layers, the first electrochemical material layer being changeable between an oxidized state which supports the first transmission mode and a reduced state which supports the second transmission mode.

10. The process of claim 9 wherein forming the plurality of second layers further comprises placing the electrolyte layer between the first electrochemical material layer and one of the first/second electrode layers.

11. The process of claim 10 wherein the first electrochemical material layer comprises hydrated tungsten oxide.

12. The process of claim 9 wherein forming the second plurality of layers further comprises placing a second electrochemical material layer between the first and second electrode layers, and providing a separation layer separating the first electrochemical material layer from the second electrochemical material layer.

13. The process of claim 12 wherein the first electrochemical material layer comprises tungsten oxide and the second electrochemical material layer comprises iridium oxide.

14. The process of claim 12 wherein the separation layer comprises an electrolyte layer placed between the first electrochemical material layer and second electrochemical material layer.

15. The process of claim 8 wherein the certain wavelengths of light which are blocked comprise wavelengths close to and including red wavelengths of light.

16. The process of claim 8 wherein the second transmission mode provides a blue-colored filter.

* * * * *